United States Patent
Ten Berge et al.

(10) Patent No.: US 10,996,573 B2
(45) Date of Patent: May 4, 2021

(54) METHOD AND SYSTEM FOR INCREASING ACCURACY OF PATTERN POSITIONING

(71) Applicant: ASML NETHERLANDS B.V., Veldhoven (NL)

(72) Inventors: Peter Ten Berge, Eindhoven (NL); David Frans Simon Deckers, Turnhout (BE); Peter Hanzen Wardenier, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/474,692

(22) PCT Filed: Dec. 13, 2017

(86) PCT No.: PCT/EP2017/082547
§ 371 (c)(1),
(2) Date: Jun. 28, 2019

(87) PCT Pub. No.: WO2018/141450
PCT Pub. Date: Aug. 9, 2018

(65) Prior Publication Data
US 2020/0124989 A1     Apr. 23, 2020

Related U.S. Application Data

(60) Provisional application No. 62/452,843, filed on Jan. 31, 2017.

(51) Int. Cl.
*G03B 27/42*     (2006.01)
*G03F 7/20*     (2006.01)
(Continued)

(52) U.S. Cl.
CPC ............ *G03F 7/70775* (2013.01); *G03F 1/70* (2013.01); *G03F 1/74* (2013.01); *G03F 7/70616* (2013.01); *G03F 7/70633* (2013.01)

(58) Field of Classification Search
CPC .... G03F 7/70775; G03F 7/70633; G03F 1/70; G03F 1/74
See application file for complete search history.

(56) References Cited

U.S. PATENT DOCUMENTS 6,844,123 B1     1/2005   Ekberg et al.
6,853,440 B1 *   2/2005   Van De Pasch ...... G03F 9/7003
                                                  355/53
(Continued)

FOREIGN PATENT DOCUMENTS

JP     H08181056     7/1996
JP     H0915834     1/1997
(Continued)

OTHER PUBLICATIONS

Machine translation of Imai et al. JP H0915834, Jan. 17, 1997.*
(Continued)

*Primary Examiner* — Peter B Kim
(74) *Attorney, Agent, or Firm* — Pillsbury Winthrop Shaw Pittman LLP

(57) ABSTRACT

A method including: obtaining error information indicative of accuracy of positioning a pattern formed on a layer on a substrate relative to a target position, wherein the pattern has been formed by irradiating the layer with a radiation beam patterned by a patterning device; and producing modification information including a map of positional shifts across the patterning device so as to increase the accuracy of positioning the pattern formed using the patterning device modified according to the modification information, the modification information based on the error information, wherein the error information is independent of any other layer on the substrate.

20 Claims, 10 Drawing Sheets

(51) Int. Cl.
 G03F 1/70 (2012.01)
 G03F 1/74 (2012.01)

(56) References Cited

U.S. PATENT DOCUMENTS

| | | |
|---|---|---|
| 2006/0066855 A1 | 3/2006 | Den Boef et al. |
| 2010/0190096 A1* | 7/2010 | Ausschnitt ............... G03F 1/68 430/5 |
| 2011/0273690 A1 | 11/2011 | Ahn et al. |
| 2012/0154773 A1 | 6/2012 | Beyer |
| 2012/0227014 A1 | 9/2012 | Pforr |
| 2015/0268565 A1 | 9/2015 | Yu et al. |
| 2016/0342080 A1 | 11/2016 | Beyer et al. |
| 2018/0024443 A1 | 1/2018 | Wittebrood |
| 2018/0322237 A1* | 11/2018 | Ten Berge ............... G03F 1/72 |

FOREIGN PATENT DOCUMENTS

| | | |
|---|---|---|
| JP | 2000150347 | 5/2000 |
| JP | 200235710 | 10/2002 |
| JP | 2013055306 | 3/2013 |
| JP | 2014504376 | 2/2014 |
| TW | 201701083 | 1/2017 |
| WO | 2016135166 | 9/2016 |

OTHER PUBLICATIONS

International Search Report and Written Opinion issued in corresponding PCT Patent Application No. PCT/EP/2017/082547, dated Apr. 19, 2018.
Taiwanese Office Action issued in corresponding Taiwanese Patent Application No. 107101142, dated Sep. 26, 2018.
Japanese Office Action issued in corresponding Japanese Patent Application No. 2019-541218, dated Sep. 15, 2020.
Chinese Office Action issued in corresponding Chinese Patent Application No. 201780085273.2, dated Jan. 6, 2021.
Korean Office Action issued in corresponding Korean Patent Application No. 10-2019-7025324, dated Feb. 16, 2021.

* cited by examiner

Fig. 7
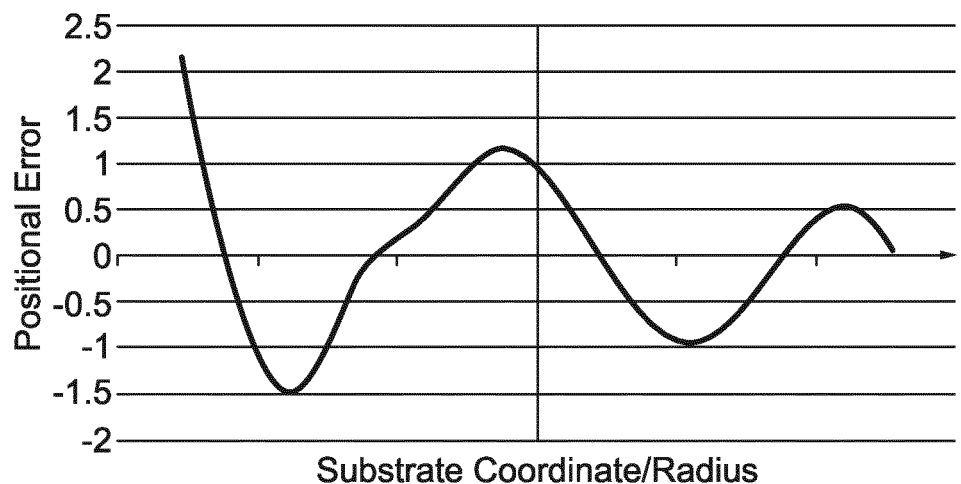
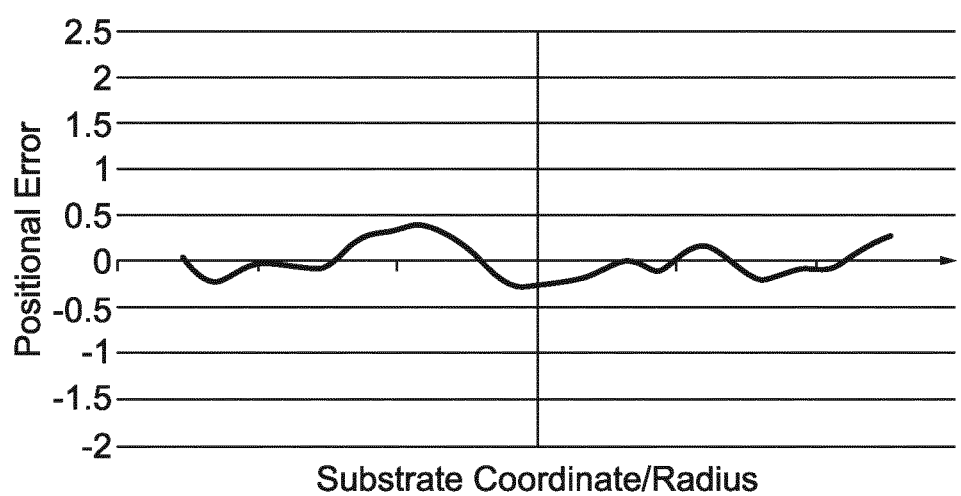
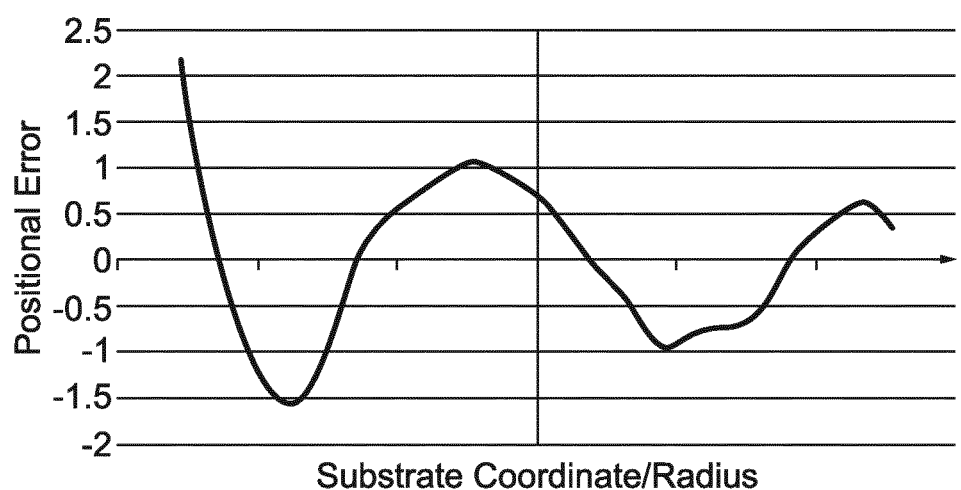

Fig. 8
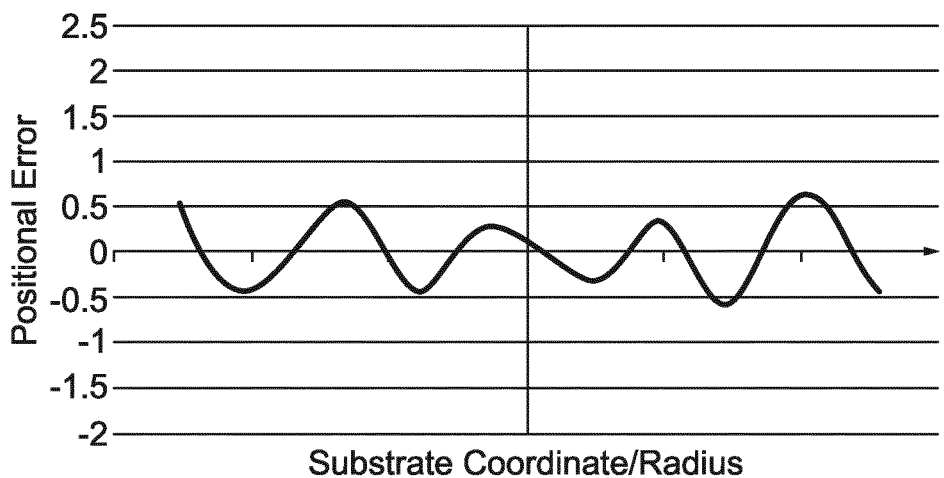
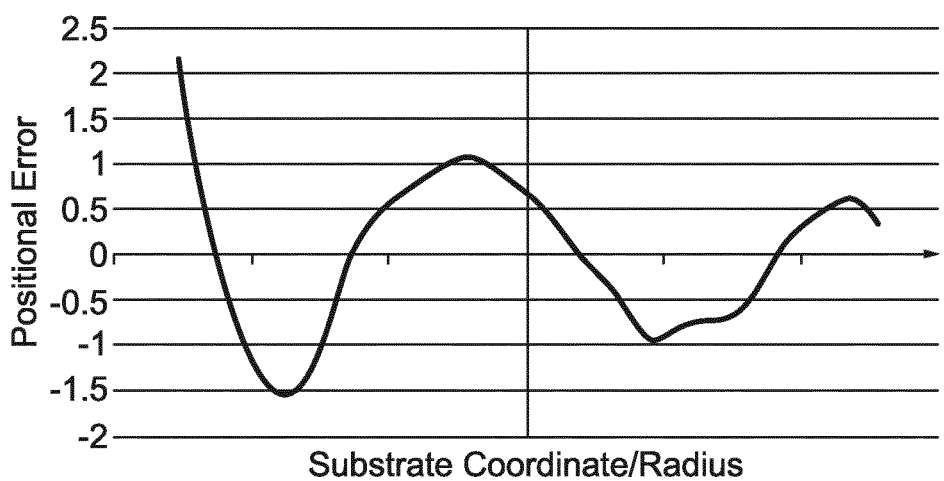
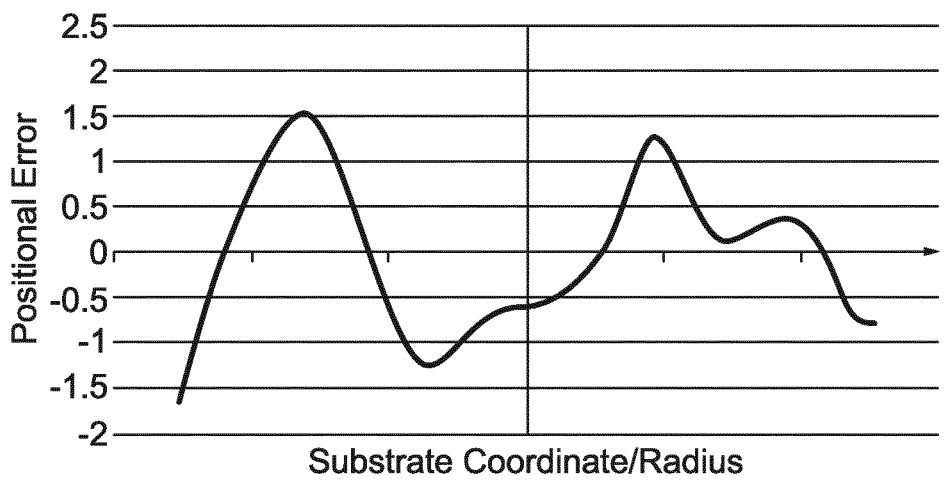

METHOD AND SYSTEM FOR INCREASING ACCURACY OF PATTERN POSITIONING

CROSS-REFERENCE TO RELATED APPLICATIONS

This application is the U.S. national phase entry of PCT Patent Application No. PCT/EP2017/082547, which was filed on Dec. 13, 2017, which claims the benefit of priority of U.S. provisional application No. 62/452,843, which was filed on Jan. 31, 2017 and which is incorporated herein in its entirety by reference.

FIELD

The present description relates to a method and a system for producing modification information for increasing the accuracy of positioning a pattern.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices designed to be functional. In that instance, a patterning device, which is alternatively referred to as a mask or a reticle, may be used to generate a device pattern to be formed on an individual layer of the device designed to be functional. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes are involved in the patterning process.

Metrology processes are used at various steps during a patterning process to monitor and control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), the measurements of the one or more characteristics may be used to alter one or more parameters of the patterning process such that further substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. Errors, such as overlay errors, CD errors, etc., will inevitably be produced in the patterning process. For example, imaging errors may be produced from optical aberration, patterning device heating, patterning device errors, and/or substrate heating and can be characterized in terms of, e.g., overlay errors, CD errors, etc. Additionally or alternatively, errors may be introduced in other parts of the patterning process, such as in etch, development, bake, etc. and similarly can be characterized in terms of, e.g., overlay errors, CD errors, etc. The errors may directly cause a problem in terms of the functional of the device, including failure of the device to function or one or more electrical problems of the functioning device.

One or more apparatuses used in the patterning process may be used to correct (e.g., at least partially, if not wholly) one or more of the errors. For example, the lithographic apparatus may be able to correct a portion of the errors by adjusting one or more actuators in the lithographic apparatus. But, a remaining error may not be correctable by the one or more actuators in the lithographic apparatus. Therefore, in general it desirable to provide a method and/or an apparatus that can further or better correct errors in the patterning process.

One way to correct errors (in particular overlay errors) is to control strains within the patterning device (e.g. reticle) of the lithographic apparatus. However, typically the strains in the patterning device are adjusted so as to correct the overlay between two patterns formed by specific lithographic apparatuses. As a result, mis-registration errors of other patterns or of the same patterns formed by other lithographic apparatuses (e.g. when the specific lithographic apparatuses are not available) are not optimally corrected. Accordingly, it is desirable to reduce the dependency of the patterning device correction on specific lithographic apparatuses being used.

SUMMARY

In an embodiment, there is provided a method comprising:

obtaining error information indicative of accuracy of positioning a pattern formed on a layer on a substrate relative to a target position, wherein the pattern has been formed by irradiating the layer with a radiation beam patterned by a patterning device; and producing modification information comprising a map of positional shifts across the patterning device so as to increase the accuracy of positioning the pattern formed using the patterning device modified according to the modification information, the modification information based on the error information, wherein the error information is independent of any other layer on the substrate.

In an aspect, there is provided a non-transitory computer program product comprising machine-readable instructions for causing a processor system to cause performance of a method described herein.

In an aspect, there is provided a system comprising: a hardware processor system; and a non-transitory computer readable storage medium storing machine-readable instructions, wherein when executed, the machine-readable instructions cause the processor system to cause execution of a method as described herein.

In an aspect, there is provided a system comprising:
a hardware processor system; and
a non-transitory computer readable storage medium storing machine-readable instructions, wherein when executed, the machine-readable instructions cause the processor system to:
obtain error information indicative of how accurately a pattern formed on a layer on a substrate is positioned relative to a target position, wherein the pattern has been formed by irradiating the layer with a radiation beam patterned by a patterning device; and
produce modification information comprising a map of positional shifts across the patterning device for modifying the patterning device so as to increase the accuracy of positioning the pattern formed using the patterning device modified according to the modification information, the modification information based on the error information, wherein the error information is independent of any other layer on the substrate.

BRIEF DESCRIPTION OF THE DRAWINGS

Embodiments will now be described, by way of example only, with reference to the accompanying drawings in which:

FIG. 7 depicts the projection system and patterning device contributions to the pattern positional error for a particular layer of a substrate stack;

FIG. 8 schematically depicts how positional error between two layers is calculated from the positional error of each layer;

DETAILED DESCRIPTION

Before describing embodiments in detail, it is instructive to present an example environment in which embodiments may be implemented.

Figure 1:
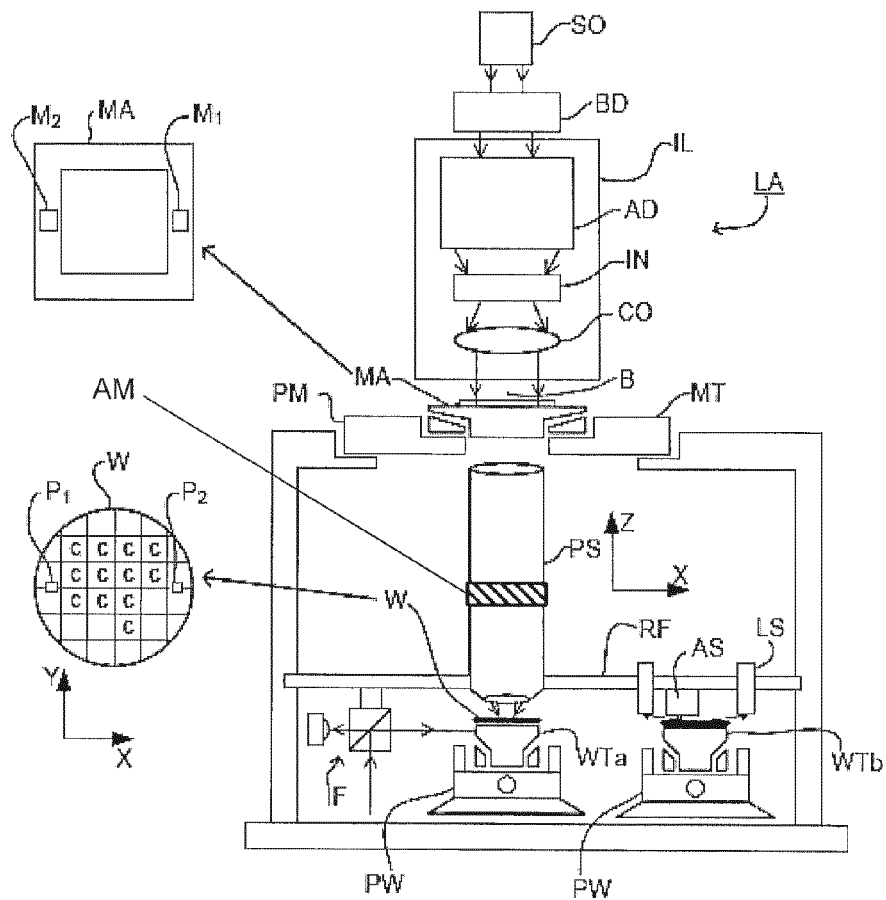
FIG. 1 schematically depicts an embodiment of a lithographic apparatus.

FIG. 1 schematically depicts a lithographic apparatus LA. The lithographic apparatus LA comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W, the projection system PS supported on a reference frame RF.

The illumination system IL may include various types of optical components, such as refractive, reflective, magnetic, electromagnetic, electrostatic or other types of optical components, or any combination thereof, for directing, shaping, or controlling radiation.

The support structure MT supports the patterning device MA in a manner that depends on the orientation of the patterning device MA, the design of the lithographic apparatus LA, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device".

The term "patterning device" used herein should be broadly interpreted as referring to any device that can be used to impart a pattern in a target portion C of the substrate W. In an embodiment, a patterning device MA is any device that can be used to impart a radiation beam B with a pattern in its cross-section so as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism AM may be operable to manipulate one or more optical (e.g., lens) elements within the projection system PS in one or more different ways. The projection system PS may have a co-ordinate system wherein its optical axis extends in the z direction. The adjustment mechanism AM may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

As here depicted, the lithographic apparatus LA is of a transmissive type (e.g. employing a transmissive mask). Alternatively, the lithographic apparatus LA may be of a reflective type (e.g. employing a programmable mirror array of a type as referred to above, or employing a reflective mask).

The lithographic apparatus LA may be of a type having two (dual stage) or more tables (e.g., two or more substrate tables WTa, WTb, two or more patterning device tables, a substrate table WTa and a table WTb below the projection system PS without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus LA may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus LA, for example, between the patterning device MA and the projection system PS. Immersion techniques are well known in the art for increasing the numerical aperture of projection systems. The term "immersion" as used herein does not mean that a structure, such as a substrate, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus LA may be separate entities, for example when the radiation source SO is an excimer laser. In such cases, the radiation source SO is not considered to form part of the lithographic apparatus LA and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus LA, for example when the radiation source SO is a mercury lamp. The radiation source SO and the illumination system IL, together with the beam delivery system BD if required, may be referred to as a radiation system.

The illumination system IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as an integrator IN and a condenser CO. The illumination system IL may be used to condition the radiation beam B, to have a desired uniformity and intensity distribution in its cross-section.

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the radiation beam B onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks $M_1$, $M_2$ and substrate alignment marks $P_1$, $P_2$. Although the substrate alignment marks $P_1$, $P_2$ as illustrated occupy dedicated target portions C, they may be located in spaces between target portions C (these are known as scribe-lane alignment marks). Similarly, in situations in which more than one die is provided on the patterning device MA, the patterning device alignment marks $M_1$, $M_2$ may be located between the dies.

The depicted lithographic apparatus LA could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
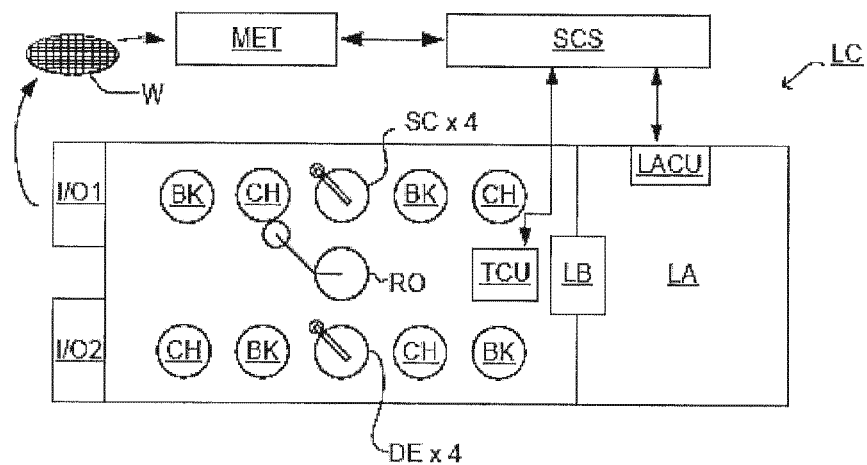
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate W. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus LA. These apparatuses, which are often collectively referred to as the track, are under the control of a track control unit TCU which is itself controlled by the supervisory control system SCS, which also controls the lithographic apparatus LA via lithography control unit LACU. Thus, the different apparatuses can be operated to maximize throughput and processing efficiency.

In order that a substrate W that is exposed by the lithographic apparatus LA is exposed correctly and consistently, it is desirable to inspect an exposed substrate to measure one or more properties such as overlay error between subsequent layers, line thickness, critical dimension (CD), focus offset, a materials property, etc. Accordingly a manufacturing facility in which the lithographic cell LC is located also typically includes a metrology system MET which receives some or all of the substrates W that have been processed in the lithographic cell LC. The metrology system MET may be part of the lithographic cell LC, for example it may be part of the lithographic apparatus LA.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, an inspection apparatus is used to determine one or more properties of the substrate, and in particular, how one or more properties of different substrates vary or different layers of the same substrate vary from layer to layer. The inspection apparatus may be integrated into the lithographic apparatus LA or the lithographic cell LC or may be a stand-alone device. To enable rapid measurement, it is desirable that the inspection apparatus measure one or more properties in the exposed resist layer immediately after the exposure. However, the latent image in the resist has a low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

In order to monitor the patterning process (e.g., a device manufacturing process) that includes at least one patterning step (e.g., an optical lithography step), the patterned substrate W is inspected and one or more parameters of the patterned substrate are measured. The one or more parameters may include, for example, overlay error between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. There are various techniques for making measurements of the structures formed in the patterning process, including the use of a scanning electron microscope, image-based measurement or inspection tools and/or various specialized tools. A fast and non-invasive form of specialized metrology and/or inspection tool is one in which a beam of radiation is directed onto a target on the surface of the substrate and properties of the scattered (diffracted/reflected) beam are measured. By comparing one or more properties of the beam before and after it has been scattered by the substrate, one or more properties of the substrate can be determined. This may be termed diffraction-based metrology or inspection. A particular application of this diffraction-based metrology or inspection is in the measurement of feature asymmetry within a periodic target. This can be used as a measure of overlay error, for example, but other applications are also known. For example, asymmetry can be measured by comparing opposite parts of the diffraction spectrum (for example, comparing the −1st and +1$^{st}$ orders in the diffraction spectrum of a periodic grating). This can be done simply as is described, for example, in U.S. patent application publication US2006-066855, which is incorporated herein in its entirety by reference.

Significant aspects to enabling a patterning process include developing the process itself, setting it up for monitoring and control and then actually monitoring and controlling the process itself. Assuming a configuration of the fundamentals of the patterning process (such as the patterning device pattern(s), the resist type(s), post-lithography process steps (such as the development, etch, etc.), etc.), the lithographic apparatus LA is setup for transferring the pattern onto the substrates, one or more metrology targets are developed to monitor the process, a metrology process is setup to measure the metrology targets and then a process of monitoring and controlling the process based on measurements is implemented. While discussion in this application will consider an embodiment of a metrology process and metrology target designed to measure overlay between one or more layers of a device being formed on a substrate and/or focus error (i.e., a difference in best focus, relative to the substrate, of an optical system of the patterning system), the embodiments herein are equally applicable to other metrology processes and/or targets, such as a metrology process and/or target to measure alignment between two objects (e.g., between a patterning device and a substrate), a metrology process and/or target to measure critical dimension, a metrology process and/or target to measure a position of a surface (e.g., a height and/or rotational position of a substrate surface using a level sensor), etc., and using such data in creating modification information for a modification apparatus of the patterning system or for a patterning device correction apparatus. Accordingly, the references herein to an overlay metrology target, overlay data, etc. should be considered as suitably modified to enable other kinds of metrology processes and/or targets.

Figure 3:
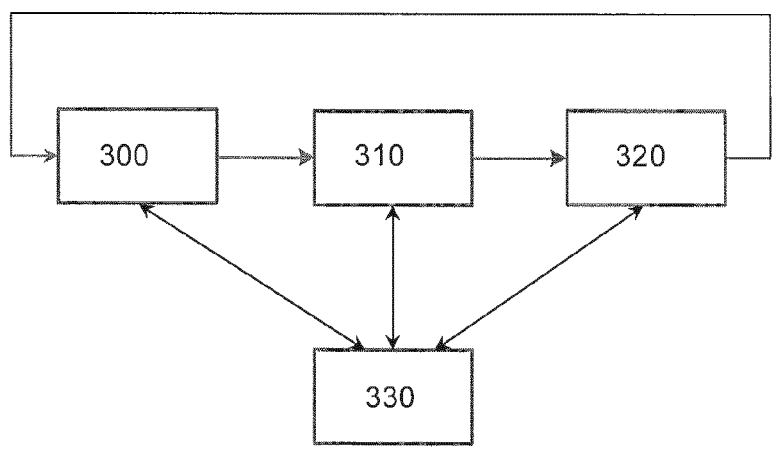
FIG. 3 schematically depicts an embodiment of a lithographic processing, metrology, and patterning device modification system.

Referring to FIG. 3, a lithographic processing, metrology, and patterning device modification system is shown. The system comprises a patterning system (e.g., a nanoimprint lithography tool, an optical lithographic apparatus LA such as described in respect of FIG. 1, a track tool such as described in respect of FIG. 2, an etch tool, another apparatus in the patterning process, or any combination selected therefrom) 300, a metrology apparatus 310, a patterning device modification tool 320, and a software application 330. Some, or all, of the patterning system 300, the metrology apparatus 310, and the patterning device modification tool 320 are in communication with the software application 330 so that results, designs, data, etc. of the patterning system 300, the metrology apparatus 310, and/or the patterning device modification tool 320 may be stored and analyzed by the software application 330 at the same time or different times.

As mentioned above, the patterning system 300 may be configured as the lithographic apparatus LA in FIG. 1. The patterning system 300 may be setup for executing the patterning aspect of the patterning process and optionally, may be configured to correct for deviations occurring within the patterning system 300 or in one or more other processes or apparatuses in the patterning process. In an embodiment, the patterning system 300 may be able to apply a correction of an error (e.g., imaging error, focus error, dose error, etc.) by adjusting one or more modification apparatuses of the patterning system 300. That is, in an embodiment, correction can be made by any manufacturing processing tool in the patterning system that can purposefully modify a patterning error.

Where, for example, the patterning system 300 comprises an optical lithographic apparatus, correction of an error can be made by adjusting one or more modification apparatuses of the lithographic apparatus, e.g., by employing the adjustment mechanism AM to correct for or apply an optical aberration, by employing the adjuster AD to correct or modify an illumination intensity distribution, by employing the positioner PM of the patterning device support structure MT and/or the positioner PW of the substrate table WT to correct or modify the position of the patterning device support structure MT and/or the substrate table WT respectively, etc. Where, for example, the patterning system 300 comprises a track tool, correction of an error can be made by adjusting one or more modification apparatuses of the track tool, e.g., modifying a bake temperature of a bake tool of the track, modifying a development parameter of a development tool of the track, etc. Similarly, where, for example, the patterning system 300 comprises an etch tool, correction of an error can be made by adjusting one or more modification apparatuses of the etch tool, e.g., modifying an etch parameter, such as etchant type, etchant rate, etc. Similarly, where, for example, the patterning system 300 comprises a planarization tool, correction of an error can be made by adjusting one or more modification apparatuses of the planarization tool, e.g., modifying a planarization parameter. Similarly, where, for example, the patterning system 300 comprises a deposition tool, correction of an error can be made by adjusting one or more modification apparatuses of the deposition tool, e.g., modifying a deposition parameter.

In an embodiment, one or more modification apparatuses of the patterning system 300 may be able to apply up to third order polynomial correction of errors (e.g., imaging error, focus error, dose error, etc.).

The metrology apparatus 310 is configured to obtain measurements related to substrates printed with patterns by the patterning system 300. In an embodiment, the metrology apparatus 310 is configured to measure or determine one or more parameters (e.g., overlay error, dose, focus, CD, etc.) of the patterns printed by the patterning system 300. In an embodiment, the metrology apparatus 310 is a diffraction-based overlay metrology tool that can measure, e.g., overlay, critical dimension and/or other parameters. In an embodiment, the metrology apparatus 310 is an alignment apparatus used to measure relative position between two objects, such as between a patterning device and a substrate. In an embodiment, the metrology apparatus 310 is a level sensor to measure a position of a surface, e.g., a height and/or rotational position of a substrate surface.

In an embodiment, the metrology apparatus 310 measures and/or determines one or more values of one or more parameters (e.g., overlay error, CD, focus, dose, etc.) associated with an error in the patterning process. After the metrology apparatus 310 finishes the measurement or determination, the software application 330 creates modification information based on the measurement data (e.g., overlay error, CD, focus, dose, etc.). In an embodiment, the software application 330 evaluates the one or more values of the one or more parameters to determine if they are within a tolerance range. If not, the software application 330 determines modification information to correct an error reflected by the out of tolerance one or more values of the one or more parameters. In an embodiment, the software application 330 uses one or more mathematical models to determine error correctable by one or more modification apparatuses of the patterning system 300 and to provide information for one or more parameters (e.g. modification information) of the one or more modification apparatuses of the patterning system 300, which one or more parameters enable configuration of the one or more modification apparatuses of the patterning system 300 to correct (e.g., eliminate or reduce to within a tolerance range) the error. In an embodiment, one or more of the mathematical models define a set of basis functions that fit the data once parameterized. In an embodiment, the one or more mathematical models comprise a model configured to simulate correctable error for the patterning system 300. In an embodiment, the model specifies a range of modifications that one or more of the modification apparatuses of the patterning system 300 can make and determines correctable error within the range. That is, the range may specify an upper limit, a lower limit, and/or both on the amount of modifications that a particular modification apparatus of the patterning system 300 can make.

In an embodiment, the software application 330 uses one or more mathematical models to determine error correctable by the patterning device modification tool 320 and to provide information for one or more parameters (e.g. modification information) of the patterning device modification tool 320, which one or more parameters enable configuration of the patterning device modification tool 320 to correct (e.g., eliminate or reduce to within a tolerance range) the error. In an embodiment, one or more of the mathematical models define a set of basis functions that fit the data once parameterized. In an embodiment, the one or more mathematical models comprise a model configured to simulate correctable error for the patterning device modification tool 320. In an embodiment, the model specifies a range of modifications that the patterning device modification tool 320 can make and determines correctable error within the range. That is, the range may specify an upper limit, a lower limit, and/or both on the amount of modifications that the patterning device modification tool 320.

In an embodiment, co-optimization of the determination of the error correctable by respectively one or more modification apparatuses of the patterning system 300 and correctable by the patterning device modification tool 320 is provided. In an embodiment, co-optimization of the determination of the error correctable by a plurality of modification apparatuses of the patterning system 300 is provided. In an embodiment, the one or more mathematical models to determine error correctable by one or more modification apparatuses of the patterning system 300 and/or the one or more mathematical models to determine error correctable by the patterning device modification tool 320 are used and/or combined to enable the co-optimization. In an embodiment, the co-optimization leads to transformation of a non-correctable error by a modification apparatus of the patterning system 300 to a correctable error by one or more other modification apparatuses of the patterning system 300 and/or by a modification of the patterning device by a patterning device modification tool 320. As an example of such transformation, an error having an uncorrectable spatial resolution for a modification apparatus of the patterning system 300 can be enabled for correction by adding further error such that the total error has a spatial resolution correctable by the modification apparatus of the patterning system 300. In an embodiment, the added error is divided among a plurality of other modification apparatuses of the patterning system 300 or divided among one or more other modification apparatuses of the patterning system 300 and the patterning device modification tool 320.

In an embodiment, the co-optimization is performed separately or on a combined basis for different types of error, such as performed separately or on a combined basis for overlay error, focus error, dose error, etc. In an embodiment, certain modification apparatuses of the patterning system 300 may be better able to correct certain types of error and so the error correction is appropriately weighted or apportioned among the suitable different modification apparatuses of the patterning system 300.

In an embodiment, a user may specify the one or more mathematical models from a collection of a plurality of mathematical models, whether that mathematical model is determined to be a fit or not. For example, an interface (such as a graphical user interface) may allow the user to specify the mathematical data model for consideration. In an embodiment, a plurality of measurement mathematical data models is determined or specified. In an embodiment, the one or more mathematical models may be tuned for optimal noise suppression (e.g., eliminating redundant orders or reducing the use of higher orders).

For example, in an embodiment, the correctable error $\Delta x$ in an x direction at the coordinate (x,y), is modeled by:

$$\Delta x = k_1 + k_3 x + k_5 y + k_7 x^2 + k_9 xy + k_{11} y^2 + k_{13} x^3 + k_{15} x^2 y + k_{17} xy^2 + k_{19} y^3 \quad (1)$$

where k1 is a parameter (that may be constant), and k3, k5, k7, k9, k11, k13, k15, k17, and k19 are parameters (that may be constant) for the terms x, y, $x^2$, xy, $y^2$, $x^3$, $x^2y$, $xy^2$, and $y^3$, respectively. One or more of k1, k3, k5, k7, k9, k11, k13, k15, k17, and k19 may be zero.

Relatedly, in an embodiment, the correctable error $\Delta y$ in a y direction at the coordinate (x,y), is modeled by:

$$\Delta y = k_2 + k_4 y + k_6 x + k_8 y^2 + k_{10} yx + k_{12} x^2 + k_{14} y^3 + k_{16} y^2 x + k_{18} yx^2 + k_{20} x^3 \quad (2)$$

where $k_2$ is a parameter (that may be constant), and $k_4$, $k_6$, $k_8$, $k_{10}$, $k_{12}$, $k_{14}$, $k_{16}$, $k_{18}$, and $k_{20}$ are parameters (that may be constant) for the terms y, x, $y^2$, yx, $x^2$, $y^3$, $y^2x$, $yx^2$, and $x^3$, respectively. One or more of $k_2$, $k_4$, $k_6$, $k_8$, $k_{10}$, $k_{12}$, $k_{14}$, $k_{16}$, $k_{18}$, and $k_{20}$ may be zero.

In an embodiment, at least part of the correctable error is corrected by the patterning system 300 through adjusting one or more of the modification apparatuses of the patterning system 300. So, in an embodiment, a portion of the error that fits the mathematical model is correctable by the patterning system 300 by adjusting one or more modification apparatuses of the patterning system 300.

A minimum remaining systematic variation for certain substrates processed in a patterning process may be specific to particular sub-processes or devices used in the processing of the substrates. The minimum remaining systematic variation is sometimes referred to as a fingerprint. The fingerprint may not be correctable by one or more modification apparatuses of the patterning system 300. In an embodiment, the fingerprint is corrected by modifying the patterning device using the patterning device modification tool 320. In an embodiment, remaining systematic variation between the measurement data and the corresponding data calculated using the model (1) and model (2) is minimized by optimizing parameters (e.g., one or more of $k_1$-$k_{20}$).

In an embodiment, the software application 330 creates first modification information for modifying the patterning device by the patterning device modification tool 320 and transmits the first modification information to the patterning device modification tool 320. In an embodiment, the first modification information effectively transforms non-correctable error by the patterning system 300 to a correctable error for the patterning system 300 upon modification by the patterning device based on the first modification information. In an embodiment, after modifying the patterning device, the software application 330 instructs the patterning device modification tool 320 to transmit the modified patterning device to the patterning system 300 for use, in for example, production. In an embodiment, further error correction and/or verification of the modified patterning device is performed as discussed below.

In an embodiment, the software application 330 further creates second modification information for one or more modification apparatuses of the patterning system 300 and transmits the second modification information to the patterning system 300. In an embodiment, the second modification information enables correction of correctable error of the patterning process by the one or more modification apparatus of the patterning system 300 upon adjustment, based upon the second modification information, of the patterning process by the one or more modification apparatuses of the patterning system 300 and use of the modified patterning device in the patterning system 300. That is, in an embodiment, one or more modification apparatus of the patterning system 300 are configured to correct the correctable error produced by the patterning device modified based on the first modification information. In an embodiment, additionally or alternatively, the second modification information corrects residual patterning error remaining after modification of the patterning device based on the first modification information.

In an embodiment, a substrate processed in the patterning system 300 with the modified patterning device and/or adjusted patterning process is forwarded to the metrology apparatus 310 for measurement. The metrology apparatus 310 performs measurement in a similar way as discussed above to evaluate whether error is within a tolerance range (e.g., by evaluating one or more values of one or more parameters (e.g., overlay error, CD, focus, dose, etc.) of the substrate measured or determined by the metrology apparatus 310). If the error is not within tolerance, in an embodiment, additional modification of the patterning device by the patterning device modification tool 320 and/or adjustment of the one or more parameters of the one or more modification apparatuses of the patterning system 300 is performed as similarly discussed herein.

In an embodiment, after the patterning device modification tool 320 modifies the patterning device based on the first and/or the second modification information, the patterning device is transferred back to the patterning system 300 to repeat the process described above until the period component of the patterning error (e.g., the overlay error, critical dimension error, side wall angle error, bottom surface tilt error, etc.) are within tolerance.

Figure 4:
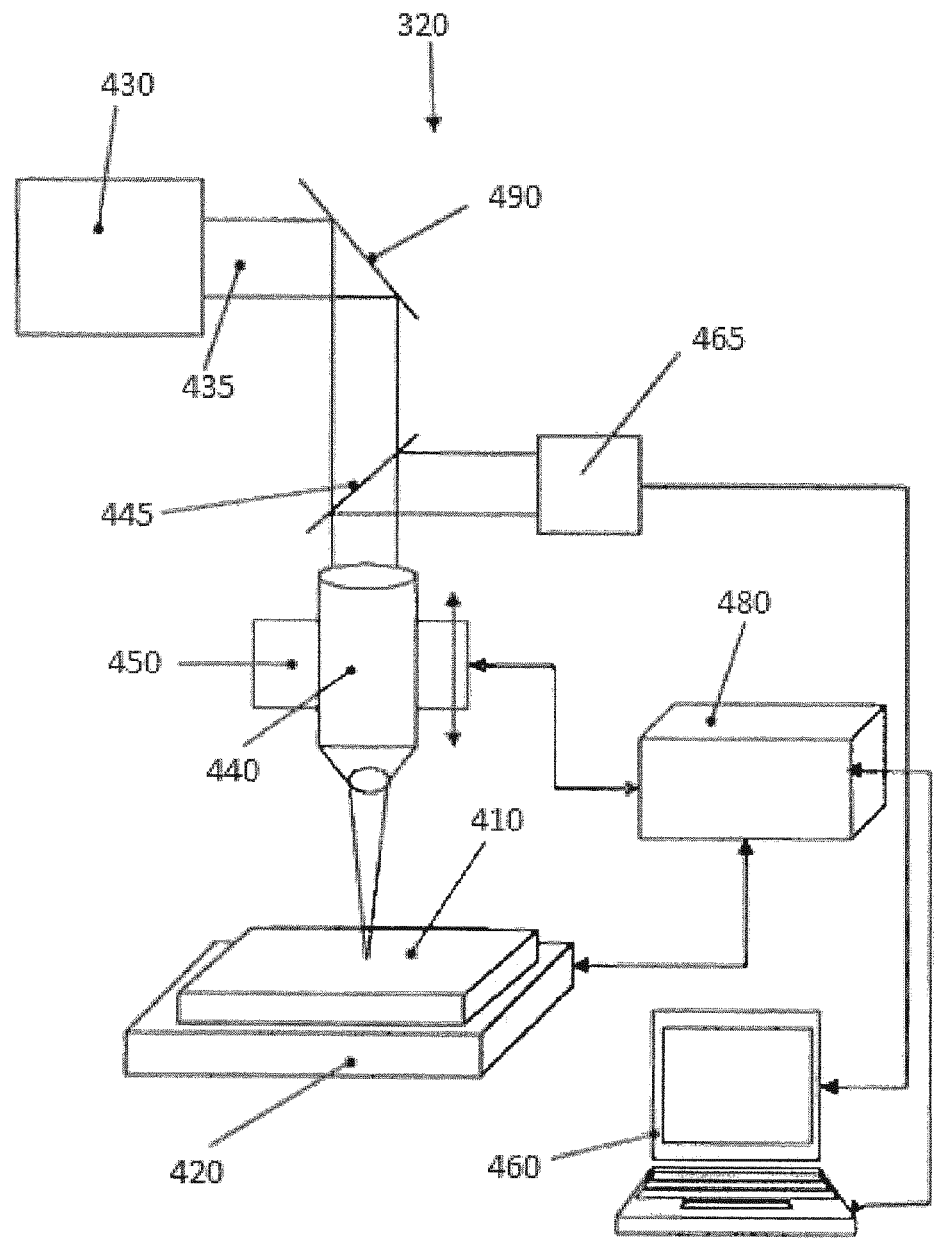
FIG. 4 schematically depicts an embodiment of a patterning device modification tool.

FIG. 4 schematically depicts a block diagram of an example patterning device modification tool 320 configured to modify a substrate of a patterning device (e.g., a photolithographic mask, an imprint template for nanoimprint lithography, etc.). The patterning device modification tool 320 comprises a table 420 which may be movable in up to six dimensions. The patterning device 410 may be held by the table 420 by using, for example, clamping.

The patterning device modification tool 320 includes a radiation output (e.g., a pulse laser source) 430 configured to produce a beam of radiation 435 (e.g., pulses of radiation). The output 430 provides radiation pulses of variable duration. Typically, the output is configured to provide radiation with a photon energy which is smaller than the band gap of the substrate of the patterning device 410 and able to provide radiation pulses having durations in the femtosecond range.

The femtosecond or ultra-short radiation pulses from the output 430 (e.g., a laser system) can, for example, write an arrangement of local deformation elements (e.g., local density variation) and/or local transmission variations in the substrate of the patterning device by altering a materials property (e.g., density) of that substrate. The local deformation element may, for example, shift one or more pattern elements on the surface of the patterning device to a predetermined position. As a result, a local strain is introduced into the patterning device MA. The local deformation causes local strain components within the plane of the substrate of the patterning device MA. Thus, the induced deformation element of the substrate can modify or correct, for example, pattern placement on the surface of the patterning device. Additionally or alternatively, an arrangement of local transmission variations can be written in the substrate of the patterning device which modifies or corrects optical transmission of radiation passing through the patterning device. In this manner, modifications or corrections can be implemented without inducing a shift of one or more pattern elements on the surface of the substrate of the patterning device. An arrangement of local deformation elements and/or local transmission variations can be defined and written which modifies or corrects pattern placement and optical transmission. In an embodiment, the local deformation elements and/or local transmission variations may be introduced in a central or inner portion of the substrate. Applying such local deformation elements and/or local transmission variations in a central or inner portion of the substrate may avoid a bending of a portion of the substrate, while, e.g., modifying or correcting pattern placement and/or optical transmission.

The steering mirror 490 directs the beam 435 into focusing objective 440. The objective 440 focuses the beam 435 onto the patterning device 410. The patterning device modification tool 320 also includes a controller 480 and a computer system 460 which manage the translations of the positioning stage of the table 420 in plane generally perpendicular to the beam (x and/or y directions) and/or translations about an axis parallel to the plane (about the x and/or y direction). The controller 480 and the computer system 460 may control the translation of the table 420 in a direction perpendicular to the plane (z direction) and/or rotation about that direction (about the z direction). Additionally or alternatively, the controller 480 and the computer system 460 may control the translation and/or rotations of the objective 440 via the positioning stage 450 to which the objective 440 is fixed. In an embodiment, the objective is fixed and all motions are performed using the table 420. In an embodiment, the patterning device modification tool 320 may comprise one or more sensors (not shown for convenience only) to detect positions of components, such as the table 420 and/or objective 440, determine focusing/leveling, etc.

The patterning device modification tool 320 may also provide a viewing system including a CCD (charge-coupled device) camera 465, which receives radiation from an illumination output (e.g., radiation source) arranged in the table 420 via optical element 445. The viewing system facilitates navigation of the patterning device 410 to the target position. Further, the viewing system may also be used to observe the formation of a modified area on the substrate material of the patterning device 410 by the beam 435 of the source 430.

The computer system 460 may be a microprocessor, a general purpose processor, a special purpose processor, a CPU (central processing unit), a GPU (graphic processing unit), or the like. It may be arranged in the controller 480, or may be a separate unit such as a PC (personal computer), a workstation, a mainframe, etc. The computer 460 may further comprise I/O (input/output) units like a keyboard, a touchpad, a mouse, a video/graphic display, a printer, etc. In addition, the computer system 460 may also comprise a volatile and/or a non-volatile memory. The computer system 460 may be realized in hardware, software, firmware, or any combination thereof. Moreover, the computer 460 may control the output 430. The computer system 460 may contain one or more algorithms, realized in hardware, software or both, which allow creation of control signals for the patterning device modification tool 320 from received data, e.g., experimental data. The control signals may control the writing of an arrangement of local deformation elements and/or local transmission variations in the substrate of the patterning device 410 in order to, for example, correct the pattern placement or optical transmission in accordance with the received data. In particular, the computer system 460 may control the source 430 and/or the table 420 positioning and/or the objective 440 positioning or optical parameters and/or the CCD camera 465.

In an embodiment, the effects of local deformation elements and/or local transmission variations may be described by a physical mathematical model that represents the deformation or variation caused by the beam. The direction of the deformation or variation is controlled by applying different local deformation elements and/or local transmission variations in the substrate having different deformation or variation properties. The deformation or variation properties of a given local deformation element and/or local transmission variation, such as magnitude and direction represent a specific mode. For example, an "X mode" represents a deformation or variation along the X axis and is described by the "X mode" properties. When the control signals are calculated, the one or more algorithms compute where and in what density each type of local deformation element and/or local transmission variation should be written. For example, a registration error in the X direction can be corrected by an X mode type of local deformation element and/or local transmission variation. The model can use several modes in order to optimize a best possible solution for a specific problem. Typically X and Y modes which are orthogonal to each other will be used but other modes such as 45° and 135° may also be used if required.

So, in an example patterning device production process, a pattern of absorbing elements is written on an absorbing layer on the substrate of a patterning device with a pattern generator. In a subsequent etching process, the absorbing pattern elements are formed from the absorbing material. A material often used for the absorbing layer on patterning devices is chromium or tungsten.

In an example patterning device modification process, the positions of the generated absorbing pattern elements may be determined with a registration metrology system (not shown) in order to determine whether, e.g., the pattern writing process was successful, i.e. the pattern elements have their predetermined size and form and are at the desired positions. Additionally or alternatively, as discussed herein, one or more patterning errors may be determined (e.g., by measurement and/or simulation). If the determined errors are not within a predetermined level, an arrangement of local deformation elements and/or local transmission variations are written into the substrate of the patterning device using, for example, the patterning device modification tool 320 of FIG. 4. The local deformation elements can shift the position of one or more pattern elements in or on the patterning device to a predetermined position and the local transmission variations can cause one or more pattern elements to behave differently in terms of imparting a pattern to the beam. Then, it may be measured whether the modification of the patterning device was successful. For example, if the measured positioning error is now below the predetermined threshold, the patterning device may be further processed (e.g., the addition of a pellicle) or used directly in production.

In an embodiment, the patterning device modification tool 320 comprises the tool that writes the pattern of the patterning device. For example, an e-beam writer may be used to create the pattern of the patterning device. The modification information described herein may be provided to such a tool to modify creation of the patterning device. In such a case, the modification information may be determined based on measurement and/or simulation results using other copies of the patterning device or using similar patterning devices. Such data may be supplemented by measured data of the patterning device that is being created (e.g., measurements obtained at the time of creation of the patterning device).

Figure 5:
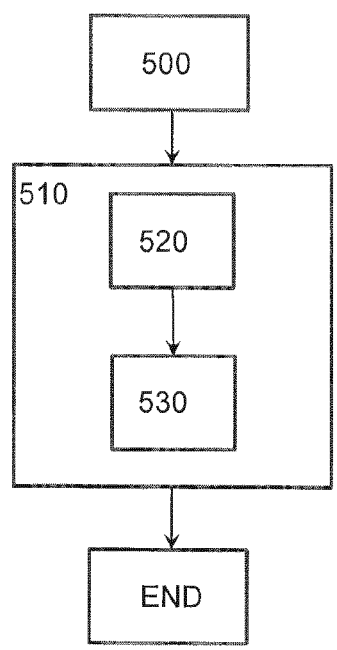
FIG. 5 schematically depicts a flow diagram of an embodiment of a method of patterning device modification by a patterning device modification tool.

Referring to FIG. 5, a flow diagram of an embodiment of a method of patterning device modification is shown. The method conducted in the flow diagram of FIG. 5 may be performed by the software application 330.

At 500, information regarding an error in patterning is obtained for a patterning device for use in a patterning system. In an embodiment, the patterning error is an error in addition to, or other than, a patterning device registration error. In an embodiment, a portion of the error is not correctable by a modification apparatus of a patterning system (e.g., the patterning system 300). In an embodiment, the patterning error information is derived based on measurement and/or simulation. In an embodiment, the patterning error information comprises one or more selected from: critical dimension information, overlay error information, focus information, and/or dose information.

At 510, modification information for modifying a patterning device based on the error information is created. In an embodiment, the modification information transforms the portion of the error to correctable error for the modification apparatus of the patterning system when the patterning device is modified according to the modification information. In an embodiment, the modification information is created based on a modification range of the modification apparatus of the patterning system. In an embodiment, the modification information is used by a patterning device modification tool 320 (such as a system the same as or similar to the system described in respect of FIG. 4).

In an embodiment, at 510, modification information for the modification apparatus of the patterning system is created based on the error information and modification information for modifying the patterning device, wherein the modification information for the modification apparatus of the patterning system includes information regarding the correctable error produced by the modified patterning device. In an embodiment, modification information for modifying the patterning device and modification information for adjusting the modification apparatus of the patterning system are co-optimized.

In an embodiment, at 510, the modification information is converted 520 to a recipe that spatially distributes across the patterning device one or more induced local deformation elements and/or local transmission variations within a substrate of the patterning device. The spatially distributed one or more induced local deformation elements and/or local transmission variations transform the portion of the patterning error to a correctable error for the patterning system (e.g., the patterning system 300). At 530, the one or more induced local deformation elements and/or local transmission variations are created within the substrate of the patterning device. In an embodiment, creating the induced local deformation element and/or local transmission variation comprises creating an induced local density and/or transmission variation by using laser pulses to change a materials property of the substrate as described above with respect to FIG. 4. The method is then finished.

Figure 6:
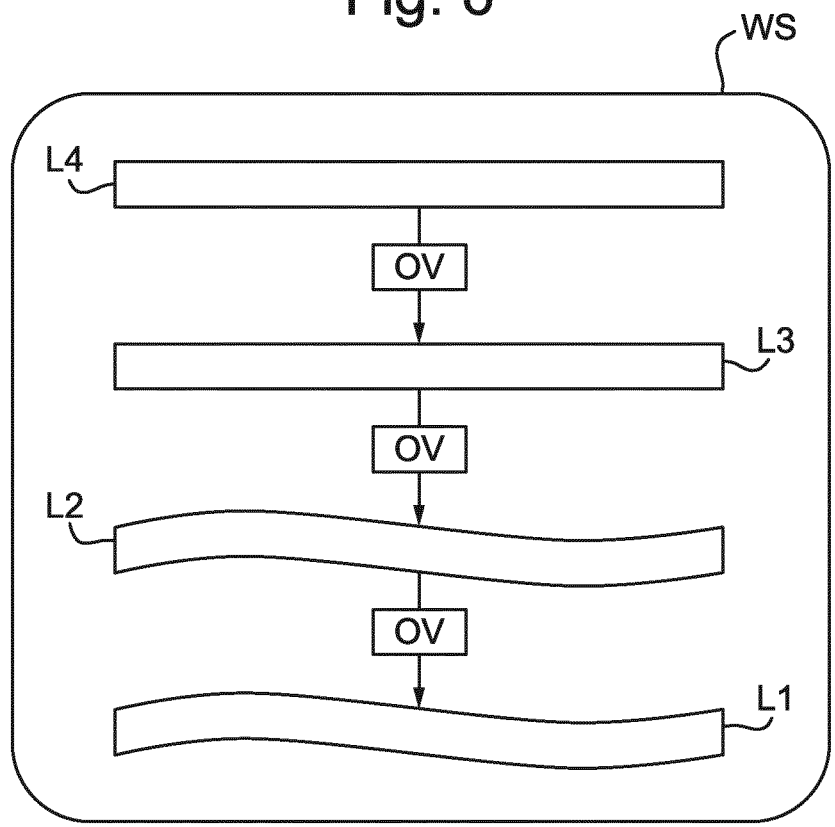
FIG. 6 schematically depicts how pattern positional errors vary between different layers of a substrate stack.

FIG. 6 schematically depicts a substrate stack WS. The substrate stack WS comprises a substrate W and a plurality of layers L1-L4 formed on the substrate W. Each layer L1-L4 comprises a pattern formed on that layer on the substrate W. There may be inaccuracies in how each pattern is formed on the corresponding layer L1-L4 on the substrate W.

In an embodiment, there is provided a method that comprises obtaining error information. The error information is indicative of the accuracy of positioning a pattern formed on a layer L1-L4 of a substrate W relative to a target position. The target position is where the pattern was intended to be formed on the layer L1-L4. In this example, each pattern has been formed by irradiating the layer L1-L4 with a radiation beam B patterned by a patterning device MA; as will be appreciated, the pattern can be created by a different kind of patterning device MA such an imprint patterning device. The inaccuracy in positioning of the pattern is caused by, for example, distortion resulting from the projection system PS and/or by patterning errors introduced by the patterning device MA. Patterning errors introduced by the patterning device MA are sometimes referred to as reticle write errors.

In an embodiment, the method comprises producing modification information. The modification information is used for increasing the accuracy of positioning the pattern formed using the patterning device MA. In particular, the modification information comprises a map of positional shifts across the patterning device MA. Hence, the modification information comprises a map of how the shape of the patterning device MA should be modified in order to reduce the contribution to the pattern's positional error caused by the patterning device MA. The modification information is suitable for increasing the accuracy of positioning the pattern formed using the patterning device MA modified according to the modification information.

In an embodiment, the modification information is based on the error information. In particular, the modification information is based on the error information which is indicative of the accuracy of positioning the pattern relative to its target position. In an embodiment the modification information is produced based on measurements taken from the pattern on a particular layer on the substrate W.

Previously techniques which involve modifying the patterning device MA are based on overlay information. Overlay is the relative misalignment between two different layers in the substrate stack WS. Hence, the overlay information is indicative of relative positional errors between two layers L1-L4 in the substrate stack WS. Here, additionally or alternatively of using relative misalignment between different layers to modify the patterning device MA, the modification information is based on error information that is independent of any other layer on the substrate W.

Thus, previously techniques use overlay data as the input data for modifying the patterning device MA. For example, referring to the substrate stack WS shown in FIG. 6, the difference in placement between an active layer L1 and a gate layer L2 may be used as the input data for the modelling. As a result, the modified version of the patterning device MA is based on characteristics of two layers, for example the active layer L1 and the gate layer L2. These characteristics are specific to the particular lithographic apparatus LA (e.g. the particular projection system PS of the lithographic apparatus LA) and are specific to the particular patterning devices that were used for patterning those two layers. As a result, the corrected patterning device MA is dedicated to the one or more particular lithographic apparatuses LA that were used in forming the two layers L1, L2. This means that the corrected patterning device MA can only appropriately be used with those one or more specific lithographic apparatuses LA forming those two layers L1, L2. This has a negative impact on the flexibility with which a lithographic apparatus LA can be used to form layers in the substrate stack WS. Accordingly, this has an impact on the throughput and/or productivity of the lithographic cell LC.

In contrast, in an embodiment, overlay data is not used as the input data for the modelling. Instead, the input data is error information associated with only one layer on the substrate W, the error information being independent of any other layer on the substrate W. In other words, the tuning or correction of the patterning device MA is based not on overlay input data, but registration error or misplacement per layer input data. This is expected to increase throughput and/or productivity of the lithographic cell LC. In particular, the corrected patterning device MA is desirably used with the lithographic apparatus LA associated with the error information, but the substrate W being patterned using the corrected patterning device may be subsequently processed using any other lithographic apparatus LA forming a different layer L1-L4 on the substrate W. The modified patterning device MA is no longer dedicated to specific lithographic apparatuses LA. Accordingly, it is not necessary to wait for a specific lithographic apparatus LA to be available in order to form a pattern on a particular layer.

An embodiment is expected to improve overlay performance of the substrate stack WS. This is explained with reference to FIG. 6 and FIGS. 10 to 12. FIG. 6 schematically shows positional errors for different layers L1-L4 in the substrate stack WS. As is shown schematically in FIG. 6, there is a significant positional error for the active layer L1 and the gate layer L2. However, the positional error for the contact layer L3 and the metal layer L4 is typically much lower compared to the positional error for the active layer L1 and the gate layer L2.

Using prior techniques, it may be possible to compensate for the overlay error between the active layer L1 and the gate layer L2. The active layer L1 and the gate layer L2 both have significant positional errors and their positional errors are different (shown by the different shapes of the layers in FIG. 6). However, compensation of the overlay between the active layer L1 and the gate layer L2 can then undesirably propagate through the substrate stack WS to the contact layer L3 and the metal layer L4, for example. This can introduce undesirable positional errors into the contact layer L3 and the metal layer L4. This may result in making overlay performance for the contact layer L3 and the metal layer L4 worse.

Figure 10:
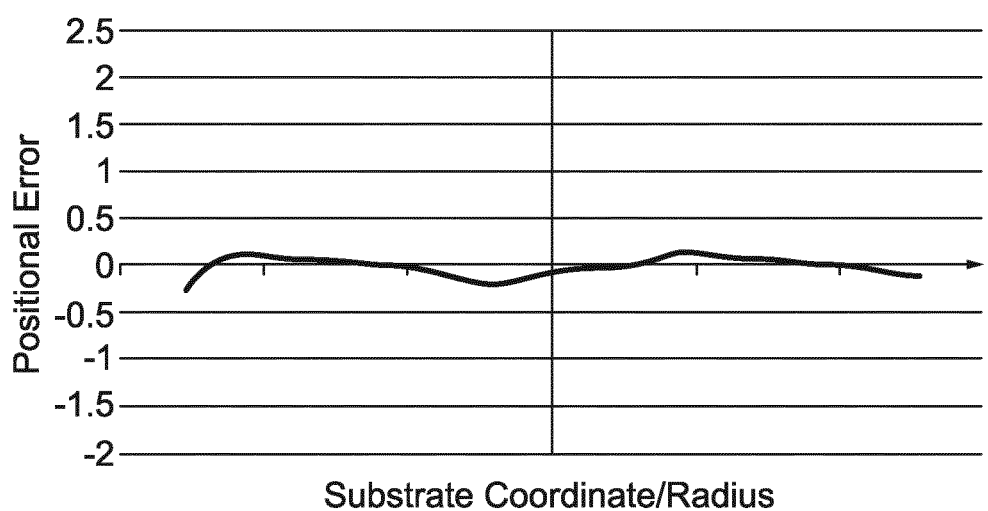
FIG. 10 depicts positional error between two layers of a substrate stack.
Figure 11:
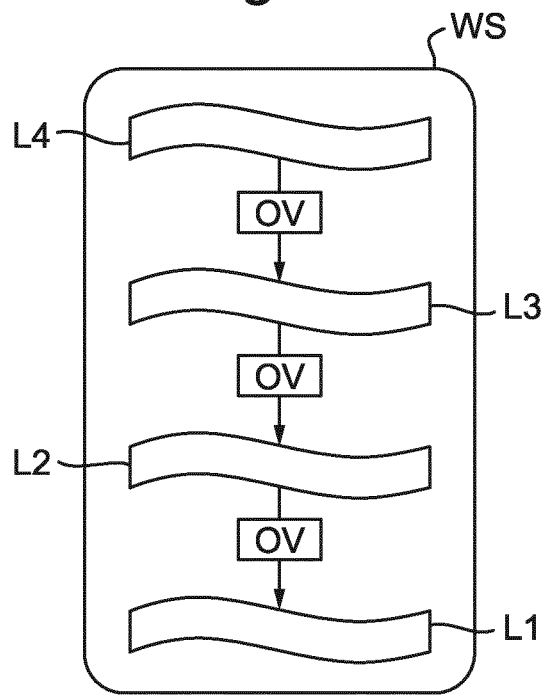
FIG. 11 schematically depicts positional errors in different layers of a substrate stack.
Figure 12:
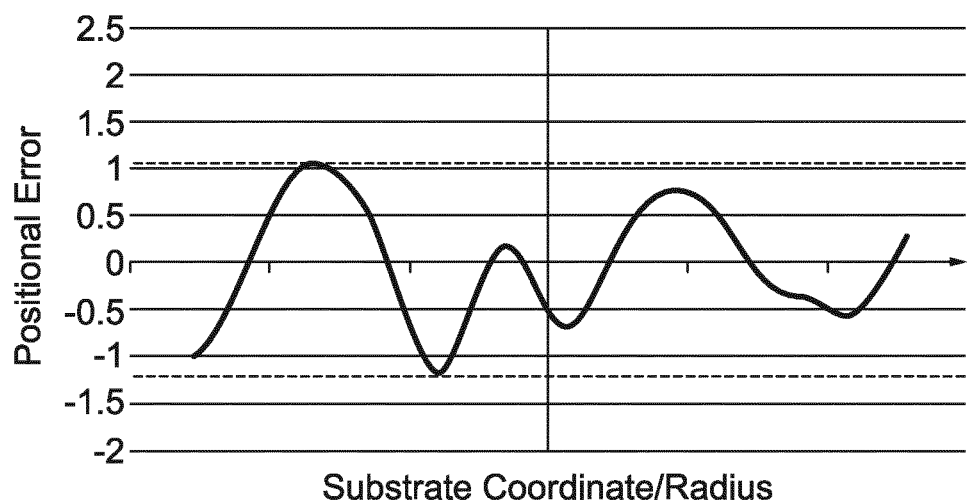
FIG. 12 depicts positional error between two of the layers of the substrate stack shown in FIG. 11.
Figure 13:
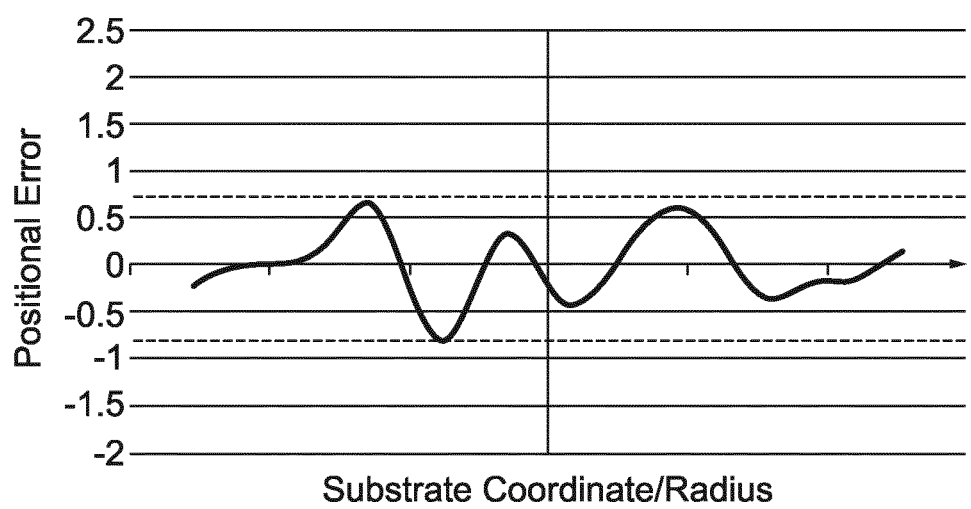
FIG. 13 depicts positional error between two of the layers of the substrate stack when an embodiment of the present invention is implemented.

For example, FIG. 11 schematically depicts a substrate stack WS that has been corrected using a prior technique. FIG. 11 shows the reduced overlay between the active layer L1 and the gate layer L2. However, FIG. 12 shows the overlay between the gate layer L2 and the contact layer L3. The overlay shown in FIG. 12 includes a component that has been introduced by the correction made to compensate for the overlay between the active layer L1 and the gate layer L2. The overlay has been made worse between the gate layer L2 and the contact layer L3. By way of comparison, an embodiment of the present invention can be implemented to reduce the overlay between the active layer L1 and the gate layer L2 as shown in FIG. 10 (i.e. the same as in the prior techniques). However, there is no propagation of error through the stack. FIG. 13 shows the overlay between the gate layer L2 and the contact layer L3 according to an embodiment of the present invention. A comparison between FIG. 12 and FIG. 13 shows that the overlay between the gate layer L2 and the contact layer L3 is lower when an embodiment of the present invention is implemented.

An embodiment of the invention improves overlay performance of the substrate stack WS by producing modification information based on the error information that is independent of any other layer on the substrate W. Accordingly, overlay errors are not propagated from one layer to the next.

FIG. 7 schematically depicts different contributions to the positional error (y-axis) across the substrate W (x-axis) in a particular layer. FIG. 7 shows three graphs. Each graph represents positional error indicative of the accuracy of positioning a pattern formed on a layer on the substrate W relative to a target position. The top graph shown in FIG. 7 represents the error caused by a projection system PS of the lithographic apparatus LA used to form the pattern. The contribution caused by the projection system PS is sometimes called the lens fingerprint. This contribution to the positional error may typically be static or systematic.

The middle graph shown in FIG. 7 represents the contribution to the patterning error caused by the patterning device MA. This contribution to the patterning error is sometimes referred to as the reticle write fingerprint.

The bottom graph shown in FIG. 7 represents the combination of the contributions shown in the first two graphs. The bottom graph is the sum of the first two graphs. The bottom graph represents the overall positional error showing the inaccuracy of positioning of the pattern formed on the layer on the substrate W.

FIG. 8 schematically depicts overlay between two layers. The middle graph of FIG. 8 is the same as the bottom graph of FIG. 7. In other words, the middle graph of FIG. 8 indicates the positional error in the active layer L1, for example.

Meanwhile, the top graph of FIG. 8, represents the positional error in a different layer, for example, the gate layer L2. The bottom graph of FIG. 8 represents the overlay between the active layer L1 and the gate layer L2. The bottom graph of FIG. 8 is formed by subtracting the middle graph from the top graph.

In the prior techniques, the input data for modifying the patterning device MA would be the bottom graph shown in FIG. 8, i.e. the overlay data. In contrast, in an embodiment of the invention, the input data for modifying the patterning device MA is or comprises the positional error of a particular layer, i.e. the bottom graph of FIG. 7.

In other words, in an embodiment, each layer L1-L4 is corrected to "zero". This means that the position of each layer L1-L4 is individually corrected to its own target position. This is done by producing modification information based on error information that is independent of any other layer on the substrate W. In an alternative embodiment, each layer L1-L4 is corrected to another common reference. In other words, each layer may be corrected not to fit to its own target position, but to a reference position relative to its target position.

Figure 9:
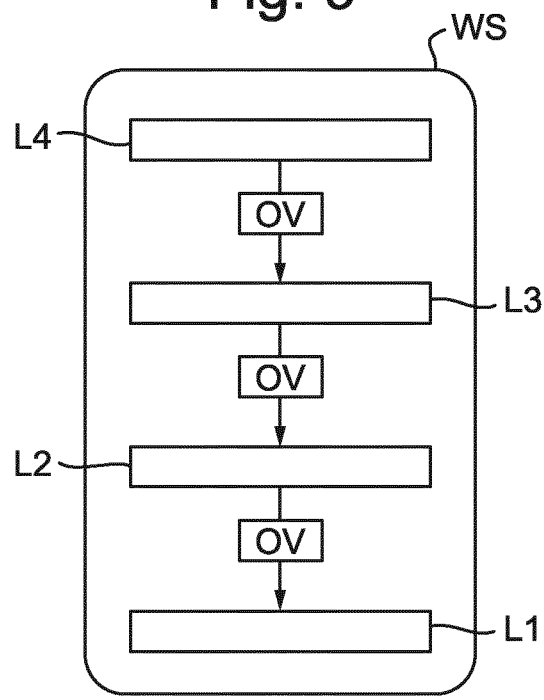
FIG. 9 schematically depicts the absence of positional errors in layers of the substrate stack according to an embodiment of the present invention.

FIG. 9 schematically depicts a substrate stack WS that has been formed using a patterning device MA that has been modified using modification information according to an embodiment of the invention. As shown in FIG. 9, each layer L1-L4 has been corrected to fit to its target position. This is indicated by the straight shape of each layer L1-L4. This is in contrast to the substrate stack WS shown in FIG. 11, in which each layer L1-L4 is not corrected to "zero", but is instead corrected relative to each other.

In an embodiment, the patterning device MA is modified so as to reduce the positional error. The modified patterning device MA introduces smaller patterning errors in the formed patterns. However, the smaller patterning errors are small enough to be correctable by tuning of the lithographic apparatus LA. Hence, the or each lithographic apparatus LA in the lithographic cell LC may be adapted/tuned so as to correct for the small patterning error introduced by the modified patterning device MA.

An embodiment of the invention is expected to increase productivity of a lithographic cell. For example, it may not be necessary to wait for a specific lithographic apparatus LA with a specific projection system PS to be available before forming a pattern on a layer L1-L4 on the substrate W.

As explained above, an embodiment of the invention is expected to reduce the dependency of a corrected patterning device MA on a specific configuration (combination) of lithographic apparatus LA. Additionally, it is desirable to make the patterning device MA non-specific to a particular machine. In an embodiment, the distortion caused by a projection system PS is calculated for at least two projection systems PS. Each projection system PS is associated with a corresponding lithographic apparatus LA. The error information is based on the average distortion calculated for the at least two projection systems PS. In other words, the average effect of a plurality of lithographic apparatuses LA can be used to take into account the distortion introduced by the projection system PS.

Of course, by taking into account the average effects of a plurality of lithographic apparatuses LA, the quality of the correction may be lower compared to a correction that is for a specific lithographic apparatus LA. However, the correction possible taking account of an average effect of a plurality of lithographic apparatuses LA is still significant and therefore desirable for improving productivity of the lithographic cell LC.

In an embodiment, the modification information that is produced comprises a map of positional shifts across the patterning device MA. The positional shifts may represent the positional shift from the original intended position of the pattern on the patterning device MA. In an embodiment, the method comprises using software to convert the positional shift into local strains for the patterning device MA.

In an embodiment, the method comprises modifying the patterning device MA based on the modification information. For example, in an embodiment, modifying the patterning device MA comprises modifying the local strain of a material from which the patterning device MA is made. In an embodiment, modifying the local strain comprises irradiating laser pulses on the patterning device MA. In other words, a piece of tooling (comprising a laser) produces local strain elements on the material of the patterning device MA. This is how the patterning device MA is modified, as has been explained in more detail above with reference to FIGS. 3 to 5.

In an embodiment, obtaining error information comprises determining distortion caused by the projection system PS that focuses the radiation beam B onto the layer L1-L4. The distortion contributes to inaccuracy of the pattern. In other words, part of obtaining the error information comprises determining (calculating and/or measuring) the distortion represented in the top graph of FIG. 7. Alternatively or additionally, the error information may be obtained by determining only the error caused by the patterning device MA, as represented by the middle graph of FIG. 7. Alternatively or additionally, the error information may be obtained by measuring the overall positional error, i.e. the bottom graph of FIG. 7.

In an embodiment, obtaining error information comprises determining a patterning error caused by the patterning device MA. As explained above, the patterning error caused by the patterning device MA contributes to the inaccuracy of the pattern. The patterning error caused by the patterning device MA is represented in the middle graph of FIG. 7, for example. Alternatively or additionally, the error information may be obtained based only on the distortion caused by the projection system PS, i.e. the contribution represented in the top graph of FIG. 7. Alternatively or additionally, the error information may be obtained by determining the overall positioning error, i.e. the information represented in the bottom graph of FIG. 7.

As explained above, in an embodiment, both the distortion caused by the projection system PS and the patterning error caused by the patterning device MA may be calculated/measured. The way that the distortion from the projection system PS is determined is different from the way that the patterning error caused by the patterning device MA is determined. Accordingly, the format of the distortion may be different from the format of the data for the patterning error caused by the patterning device MA. Hence, further process steps may be required in order to combine the determined distortion and the determined patterning error.

In an embodiment, the method comprises combining the determined distortion and the determined patterning error such that the modification information is based on both the determined distortion and the determined patterning error. Alternatively, if only one of the distortion and the patterning error is used, then such a combining step is not necessary.

In an embodiment, the method comprises mapping between the distortion and the determined patterning error.

In particular, the distortion may be represented on a first type of grid showing the distortion effects in the X-direction and the Y-direction. The determined patterning error may be represented by a second type of grid showing the patterning error in the X-direction and the Y-direction. The first type of grid may be different from the second type of grid. In an embodiment, the patterning error caused by the patterning device MA is combined with the distortion measurements related to the projection system PS so as to form a further grid showing the actual modifications to be made, e.g. a map of positional shifts across the patterning device MA. Mapping is needed between the types of grids so that they can be combined. For example, in an embodiment, the distortion data and/or the patterning error data is interpolated so as to equalize the number and/or distribution of data points between the grids. Alternatively or additionally, modelling may be performed to perform up-sampling of one set of data so that the distribution of data matches the other set of data.

In an embodiment, the method comprises determining the distortion at a location associated with a determined patterning error on the patterning device MA. For example, it may be that the patterning error is determined at a large number of locations on the patterning device MA, whereas the distortion is calculated at a smaller number of locations (i.e. a lower number of data points). Hence, there may be locations associated with determined patterning errors on the patterning device MA for which no distortion data is available. In an embodiment, the additional distortion data locations associated with the determined patterning error on the patterning device MA can be determined so that the distortion data can be combined with the determined patterning error data.

In an embodiment, combining the calculated distortion and the determined patterning error comprises mapping the calculated distortion and the determined patterning error to a common grid.

In an embodiment, the error information is mapped into a grid associated with the modification information. Hence, a particular type of grid (i.e. format of data) may be used for the modification information. The error information is mapped into that grid.

In an embodiment, the method comprises repeating the steps of obtaining error information and producing modification information for each of a plurality of layers L1-L4 with corresponding patterns on the substrate W. Hence, as shown in FIG. 9, each layer may be corrected for by obtaining the error information and producing the modification information.

In an embodiment, the method comprises determining a correction to a lithographic apparatus LA that comprises or uses the patterning device MA, the correction being associated with the modification information. In particular, there are some types of errors that can be corrected for by tuning the lithographic apparatus LA whereas other types of error cannot be compensated for by tuning of the lithographic apparatus LA. For example, the positional errors for an active layer L1 and a gate layer L2 are typically too high order or too large to be compensated for merely by tuning of the lithographic apparatus LA. Instead, as explained above, modification information is used to aid in modifying the patterning device MA so as to compensate for these high order errors.

However, other types of error are lower order errors having lower magnitudes and can be compensated for merely by tuning of the lithographic apparatus. For example, the positional errors in a contact layer L3 and/or a metal layer L4 may typically be compensated for by tuning of the lithographic apparatus. Hence, in an embodiment the method comprises determining a correction associated with an offset correctable by the lithographic apparatus LA.

As explained above, the modification of the patterning device MA may comprise modifying the local strain of the material from which the patterning device MA is made. The modification of the local strain can undesirably lead to a global scaling error. For example, the modified version of the patterning device MA may magnify the pattern by a different factor compared to the unmodified version of the patterning device MA.

For example, the total sum of the local strains can lead to a slight expansion of the patterning device MA when it undergoes the modification. By summing the local strains it is possible to determine the scaling error that is introduced by modifying the patterning device MA. The scaling error that will be introduced can be known before the modified patterning device MA is used. The scaling error can be corrected for by tuning the lithographic apparatus LA. Hence, the lithographic apparatus LA can correct for the scaling error, for example by changing the distance between the patterning device MA and the projection system PS. In an embodiment, when the modification information is produced, the appropriate correction to the lithographic apparatus LA (e.g. to correct for the global scaling error) is determined and provided for controlling the lithographic apparatus LA.

In an embodiment, the method comprises determining a correction to the lithographic apparatus LA, where the correction is associated with an offset of metrology features and product features. The patterning device MA may comprise both metrology features and product features. The metrology features are used for making measurements associated with the pattern formed using the patterning device MA. The product features are features of the patterning device MA that contribute to the required shape of the pattern (e.g. to form a particular circuit). The offset of metrology features and product features corresponds to the distance between metrology features and product features on the patterning device MA.

In an embodiment, the method comprises determining a correction based on a difference in sampling density between a first grid associated with the modification information and a second grid associated with the correction to the lithographic apparatus LA. In particular, the modification information may comprise high density information including a large number of data points across the patterning device MA. Hence, the first grid associated with the modification information may comprise particularly dense sampling. Meanwhile, the second grid associated with the correction to the lithographic apparatus LA may comprise much more sparse information. For example, the second grid associated with the correction to the lithographic apparatus LA may have less than 10% (e.g. about 1%) of the number of data points as the first grid associated with the modification information.

The second grid associated with the correction to the lithographic apparatus LA can be more sparse, and would therefore provide a less accurate scaling offset correction. However, the scaling offset correction can be determined more accurately from the more dense first grid associated with the modification information. Therefore, it is possible to calculate in advance what the difference in calculated scaling offset correction would be depending on whether the first grid associated with the modification information and the second grid associated with the correction to the lithographic apparatus LA is used. Hence, the correction can be based (at least partly) on the difference in sampling density between the first grid and the second grid.

Although the offsets correctable by the lithographic apparatus LA have been explained above in the context of a global scaling error, other types of corrections can be made. For example, another type of error that is correctable by tuning the lithographic apparatus LA is a rotation. Hence, the correction that is made by the lithographic apparatus LA itself may comprise a scaling and/or a rotation.

Information about the appropriate scaling and/or rotation can be determined from the modification information and fed forward to the lithographic apparatus LA. This means that the appropriate correction can be made by tuning the lithographic apparatus LA even before the modified patterning device MA is used for the first time. Of course, further corrections can subsequently be made based on measurements made after the use of the modified patterning device MA.

In an embodiment, there is provided a method comprising: obtaining error information indicative of the accuracy of positioning a pattern formed on a layer on a substrate relative to a target position, wherein the pattern has been formed by irradiating the layer with a radiation beam patterned by a patterning device; and producing modification information comprising a map of positional shifts across the patterning device so as to increase the accuracy of positioning the pattern formed using the patterning device modified according to the modification information, the modification information based on the error information, wherein the error information is independent of any other layer on the substrate.

In an embodiment, obtaining error information comprises determining distortion caused by a projection system that focuses the radiation beam onto the layer, the distortion contributing to inaccuracy of the pattern. In an embodiment, the distortion is determined for at least two projection systems and the error information is based on the average distortion calculated for the at least two projection systems. In an embodiment, obtaining error information comprises determining a patterning error caused by the patterning device, the patterning error contributing to inaccuracy of the pattern. In an embodiment, the method comprises combining the determined distortion and the determined patterning error such that the modification information is based at least on both the calculated distortion and the determined patterning error. In an embodiment, the method comprises determining the distortion at a location associated with a determined patterning error on the patterning device. In an embodiment, combining the calculated distortion and the determined patterning error comprises mapping the calculated distortion and the determined patterning error to a common grid. In an embodiment, the error information is mapped onto a grid associated with the modification information. In an embodiment, the method comprises modifying the patterning device based on the modification information. In an embodiment, modifying the patterning device comprises modifying a local strain of a material from which the patterning device is made. In an embodiment, modifying the local strain, local property influencing the positioning of the patterning device comprises irradiating laser pulses on the patterning device. In an embodiment, the method comprises repeating the steps of obtaining error information and producing modification information for each of a plurality of layers with corresponding patterns on the substrate. In an embodiment, determining a correction to a lithographic apparatus comprising the patterning device, the correction being associated with the modification information. In an embodiment, the correction is further associated with an offset correctable by the lithographic apparatus. In an embodiment, the correction is further associated with an offset of metrology features and product features. In an embodiment, the correction is based on a difference in sampling density between a first grid associated with the modification information and a second grid associated with the correction to the lithographic apparatus.

In an embodiment, there is provided a non-transitory computer program product comprising machine-readable instructions for causing a processor system to cause performance of a method as described herein.

In an embodiment, there is provided a system comprising: a hardware processor system; and a non-transitory computer readable storage medium storing machine-readable instructions, wherein when executed, the machine-readable instructions cause the processor system to: obtain error information indicative of how accurately a pattern formed on a layer on a substrate is positioned relative to a target position, wherein the pattern has been formed by irradiating the layer with a radiation beam patterned by a patterning device; and produce modification information comprising a map of positional shifts across the patterning device for modifying the patterning device so as to increase the accuracy of positioning the pattern formed using the patterning device modified according to the modification information, the modification information based on the error information, wherein the error information is independent of any other layer on the substrate.

In an embodiment, there is provided a system comprising: a hardware processor system; and a non-transitory computer readable storage medium storing machine-readable instructions, wherein when executed, the machine-readable instructions cause the processor system to perform a method as described herein.

An embodiment of the disclosure may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs. Although specific reference may be made in this text to the use of inspection apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example nanoimprint lithography, and where the context allows, is not limited to optical lithography. In the case of nanoimprint lithography, the patterning device is an imprint template or mold. The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

References herein to crossing or passing a threshold may include something having a value lower than a specific value or lower than or equal to a specific value, something having a value higher than a specific value or higher than or equal to a specific value, something being ranked higher or lower than something else (through e.g., sorting) based on, e.g., a parameter, etc.

References herein to correcting or corrections of an error include eliminating the error or reducing the error to within a tolerance range.

The term "optimizing" and "optimization" as used herein refers to or means adjusting a lithographic apparatus, a patterning process, etc. such that results and/or processes of lithography or patterning processing have more desirable characteristics, such as higher accuracy of projection of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

In an optimization process of a system, a figure of merit of the system or process can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system or process with respect to the intended values (e.g., ideal values) of these characteristics; the cost function can also be the maximum of these deviations (i.e., worst deviation). The term "evaluation points" herein should be interpreted broadly to include any characteristics of the system or process. The design variables of the system can be confined to finite ranges and/or be interdependent due to practicalities of implementations of the system or process. In the case of a lithographic apparatus or patterning process, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

While specific embodiments of the disclosure have been described above, it will be appreciated that the disclosure may be practiced otherwise than as described. For example, the disclosure may take the form of a computer program containing one or more sequences of machine-readable instructions describing a method as disclosed above, or a data storage medium (e.g. semiconductor memory, magnetic or optical disk) having such a computer program stored therein.

Further embodiments are disclosed in the list of numbered embodiments below:

1. A method comprising:
    obtaining error information indicative of the accuracy of positioning a pattern formed on a layer on a substrate relative to a target position, wherein the pattern has been formed in the layer using a patterning device; and
    producing modification information comprising a map of positional shifts across the patterning device so as to increase the accuracy of positioning the pattern formed using the patterning device modified according to the modification information, the modification information based on the error information, wherein the error information is independent of any other layer on the substrate.
2. The method of embodiment 1, wherein obtaining error information comprises determining distortion caused by a projection system that focuses a radiation beam onto the layer, the distortion contributing to inaccuracy of the pattern.
3. The method of embodiment 2, wherein the distortion is determined for at least two projection systems and the error information is based on the average distortion calculated for the at least two projection systems.
4. The method of any preceding embodiment, wherein obtaining error information comprises determining a patterning error caused by the patterning device, the patterning error contributing to inaccuracy of the pattern.
5. The method of embodiment 4, comprising combining the determined distortion and the determined patterning error such that the modification information is based at least on both the determined distortion and the determined patterning error.
6. The method of embodiment 5, comprising determining the distortion at a location associated with a determined patterning error on the patterning device.
7. The method of embodiment 5 or embodiment 6, wherein combining the determined distortion and the determined patterning error comprises mapping the determined distortion and the determined patterning error to a common grid.
8. The method of any preceding embodiment, wherein the error information is mapped onto a grid associated with the modification information.

9. The method of any preceding embodiment, comprising modifying the patterning device based on the modification information.

10. The method of embodiment 9, wherein modifying the patterning device comprises modifying a local strain of a material from which the patterning device is made.

11. The method of embodiment 10, wherein modifying the local strain comprises irradiating laser pulses on the patterning device.

12. The method of any preceding embodiment, comprising repeating the obtaining error information and producing modification information for each of a plurality of layers with corresponding patterns on the substrate.

13. The method of any preceding embodiment, comprising determining a correction to a lithographic apparatus using the patterning device, the correction being associated with the modification information.

14. The method of embodiment 13, wherein the correction is further associated with an offset correctable by the lithographic apparatus.

15. The method of embodiment 13 or embodiment 14, wherein the correction is further associated with an offset of metrology features and product features.

16. The method of any of embodiments 13-15, wherein the correction is based on a difference in sampling density between a first grid associated with the modification information and a second grid associated with the correction to the lithographic apparatus.

17. A non-transitory computer program product comprising machine-readable instructions for causing a processor system to cause performance of the method of any preceding embodiment.

18. A system comprising:
  a hardware processor system; and
  a non-transitory computer readable storage medium storing machine-readable instructions, wherein when executed, the machine-readable instructions cause the processor system to:
  obtain error information indicative of how accurately a pattern formed on a layer on a substrate is positioned relative to a target position, wherein the pattern has been formed using a patterning device; and
  produce modification information comprising a map of positional shifts across the patterning device for modifying the patterning device so as to increase the accuracy of positioning the pattern formed using the patterning device modified according to the modification information, the modification information based on the error information, wherein the error information is independent of any other layer on the substrate.

19. A system comprising:
  a hardware processor system; and
  a non-transitory computer readable storage medium storing machine-readable instructions, wherein when executed, the machine-readable instructions cause the processor system to perform the method of any of embodiments 1 to 16.

The descriptions above are intended to be illustrative, not limiting. Thus, it will be apparent to one skilled in the art that modifications may be made to the disclosure as described without departing from the scope of the claims set out below.

What is claimed is:

1. A method comprising:
  obtaining error information indicative of accuracy of positioning a pattern formed on a layer on a substrate relative to a target position, wherein the pattern has been formed in the layer using a patterning device; and
  producing modification information comprising a map of positional shifts across the same patterning device so as to increase the accuracy of positioning the pattern formed using the same patterning device structurally modified according to the modification information, the modification information based on the error information, wherein the error information is independent of any other layer on the substrate.

2. The method of claim 1, wherein obtaining error information comprises determining distortion caused by a projection system that focuses a radiation beam onto the layer, the distortion contributing to inaccuracy of the pattern.

3. The method of claim 2, wherein the distortion is determined for at least two projection systems and the error information is based on the average distortion calculated for the at least two projection systems.

4. The method of claim 1, wherein obtaining error information comprises determining a patterning error caused by the patterning device, the patterning error contributing to inaccuracy of the pattern.

5. The method of claim 4, wherein obtaining error information comprises determining distortion caused by a projection system that focuses a radiation beam onto the layer, the distortion contributing to inaccuracy of the pattern, and comprising combining the determined distortion and the determined patterning error such that the modification information is based at least on both the determined distortion and the determined patterning error.

6. The method of claim 5, comprising determining the distortion at a location associated with a determined patterning error on the patterning device.

7. The method of claim 5, wherein combining the determined distortion and the determined patterning error comprises mapping the determined distortion and the determined patterning error to a common grid.

8. The method of claim 1, wherein the error information is mapped onto a grid associated with the modification information.

9. The method of claim 1, comprising modifying the patterning device based on the modification information.

10. The method of claim 9, wherein modifying the patterning device comprises modifying a local strain of a material from which the patterning device is made.

11. The method of claim 10, wherein modifying the local strain comprises irradiating laser pulses on the patterning device.

12. The method of claim 1, comprising repeating the obtaining error information and producing modification information for each of a plurality of layers with corresponding patterns on the substrate.

13. The method of claim 1, comprising determining a correction to a lithographic apparatus using the patterning device, the correction being associated with the modification information.

14. The method of claim 13, wherein the correction is based on a difference in sampling density between a first grid associated with the modification information and a second grid associated with the correction to the lithographic apparatus.

15. The method of claim 13, wherein the correction is further associated with an offset correctable by the lithographic apparatus.

16. The method of claim 13, wherein the correction is further associated with an offset of metrology features and product features.

17. A system comprising:
a hardware processor system; and
a non-transitory computer readable storage medium storing machine-readable instructions, the machine-readable instructions, upon execution, configured to cause the processor system to at least perform the method of claim 1.

18. A non-transitory computer program product comprising machine-readable instructions therein, the instructions, upon execution by a processor system, configured to cause the processor system to at least:
obtain error information indicative of accuracy of positioning a pattern formed on a layer on a substrate relative to a target position, wherein the pattern has been formed in the layer using a patterning device; and
produce modification information comprising a map of positional shifts across the same patterning device so as to increase the accuracy of positioning the pattern formed using the same patterning device structurally modified according to the modification information, the modification information based on the error information, wherein the error information is independent of any other layer on the substrate.

19. The non-transitory computer program product of claim 18, wherein the obtaining of error information comprises determination of distortion caused by a projection system that focuses a radiation beam onto the layer, the distortion contributing to inaccuracy of the pattern, and/or determination of a patterning error caused by the patterning device, the patterning error contributing to inaccuracy of the pattern.

20. A system comprising:
a hardware processor system; and
a non-transitory computer readable storage medium storing machine-readable instructions, wherein when executed, the machine-readable instructions cause the processor system to at least:
obtain error information indicative of how accurately a pattern formed on a layer on a substrate is positioned relative to a target position, wherein the pattern has been formed using a patterning device; and
produce modification information comprising a map of positional shifts across the same patterning device for modifying the same patterning device so as to increase the accuracy of positioning the pattern formed using the patterning device structurally modified according to the modification information, the modification information based on the error information, wherein the error information is independent of any other layer on the substrate.

* * * * *